US010103640B2

(12) United States Patent
Zhao et al.

(10) Patent No.: US 10,103,640 B2
(45) Date of Patent: Oct. 16, 2018

(54) POWER CONVERTER

(71) Applicant: Huawei Technologies Co., Ltd., Shenzhen (CN)

(72) Inventors: Yazhu Zhao, Shanghai (CN); Yunfeng Liu, Shanghai (CN); Kai Xin, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 777 days.

(21) Appl. No.: 14/624,238

(22) Filed: Feb. 17, 2015

(65) Prior Publication Data
US 2015/0236607 A1 Aug. 20, 2015

(30) Foreign Application Priority Data
Feb. 20, 2014 (CN) .......................... 2014 1 0059013

(51) Int. Cl.
| | |
|---|---|
| *H02M 7/00* | (2006.01) |
| *H02G 5/06* | (2006.01) |
| *H02M 7/537* | (2006.01) |
| *H05K 7/14* | (2006.01) |

(52) U.S. Cl.
CPC .............. *H02M 7/003* (2013.01); *H02G 5/06* (2013.01); *H02M 7/537* (2013.01); *H05K 7/1427* (2013.01); *Y10T 307/707* (2015.04)

(58) Field of Classification Search
CPC .... Y10T 307/707; H02M 7/003; H02M 7/487
(Continued)

(56) References Cited

U.S. PATENT DOCUMENTS

| | | | | |
|---|---|---|---|---|
| 2009/0015185 | A1* | 1/2009 | Yoshida | ................... B60K 6/26 318/504 |
| 2009/0219696 | A1* | 9/2009 | Nakayama | ............ H02M 7/003 361/709 |

(Continued)

FOREIGN PATENT DOCUMENTS

| | | |
|---|---|---|
| CN | 201887671 U | 6/2011 |
| CN | 202135072 U | 2/2012 |

(Continued)

OTHER PUBLICATIONS

English Abstract for CN203026192U (published Jun. 26, 2013), Shenzhen Busbar Sci Tech Dev Co Ltd.*

(Continued)

*Primary Examiner* — Fritz M Fleming
(74) *Attorney, Agent, or Firm* — Conley Rose, P.C.

(57) ABSTRACT

A power converter, including: at least two inverting modules, where direct current sides of the at least two inverting modules are connected in parallel using a laminated busbar or a circuit board, and the at least two inverting modules run in an interleaved and parallel manner. In the present invention, the power converter is formed by connecting at least two inverting modules in parallel, and the direct current sides of the at least two inverting modules are connected in parallel using the laminated busbar or the circuit board, so that parasitic inductance between inverting modules is small, forming a low parasitic inductance loop. When the at least two inverting modules run in an interleaved and parallel manner, the low parasitic inductance loop counteracts most ripple currents in a circuit, thereby reducing the burden of the ripple currents on a bus capacitor. Therefore, the demand of the power converter provided in the present invention for the bus capacitor is small.

19 Claims, 5 Drawing Sheets

(58) Field of Classification Search
USPC .......................................................... 174/68.2
See application file for complete search history.

(56) References Cited

U.S. PATENT DOCUMENTS

2009/0283129 A1* 11/2009 Foss ..................... H02M 7/493
136/244
2010/0327654 A1   12/2010 Azuma et al.
2014/0111959 A1    4/2014 Li et al.

FOREIGN PATENT DOCUMENTS

| CN | 102522908 A |   | 6/2012 |
|----|-------------|---|--------|
| CN | 102882385 A |   | 1/2013 |
| CN | 103546044 A |   | 1/2014 |
| JP | 2005192296 A | * | 7/2005 |

OTHER PUBLICATIONS

EPO Machine Translation for JP2005192296, printed Mar. 13, 2018.*
Partial English Translation and Abstract of Chinese Patent Application No. CN102522908, Oct. 12, 2015, 4 pages.
Partial English Translation and Abstract of Chinese Patent Application No. CN103546044, Oct. 12, 2015, 5 pages.
Partial English Translation and Abstract of Chinese Patent Application No. CN202135072, Oct. 12, 2015, 4 pages.
Foreign Communication From a Counterpart Application, Chinese Application No. 201410059013.6, Chinese Office Action dated Sep. 6, 2015, 11 pages.

* cited by examiner

POWER CONVERTER

CROSS-REFERENCE TO RELATED APPLICATION

This application claims priority to Chinese Patent Application No. 201410059013.6, filed on Feb. 20, 2014, which is hereby incorporated by reference in its entirety.

TECHNICAL FIELD

The present invention relates to the field of electrics, and in particular, to a power converter.

BACKGROUND

A power converter is widely applied to fields such as variable frequency drive, wind power generation, and photovoltaic power generation. In the power converter, a bus capacitor provides main functions such as high-frequency filtering, maintaining bus voltage stability, and energy support, but the cost of the bus capacitor is high and occupies a large proportion in the cost structure of the power converter. Therefore, reducing bus capacitor usage becomes an important way of reducing the cost of the power converter.

At present, the prior art provides a power converter in modular design. As shown in FIG. 1, such a power converter is formed by directly connecting power modules 101 in parallel using copper bars 102. However, large parasitic inductance exists between direct current bus capacitors of different power modules. As shown in FIG. 2, FIG. 2 is a schematic diagram of a circuit principle of two inverting modules connected in parallel. In FIG. 2, a power converter includes an inverting module 1 and an inverting module 2, where the inverting module 1 includes an insulated gate bipolar transistor (IGBT) module A1, an IGBT module B1 and an IGBT module C1, the inverting module 2 includes an IGBT module A2, an IGBT module B2 and an IGBT module C2, and the IGBT module A1 and the IGBT module A2 are connected in parallel. Here the IGBT modules are IGBT inverting modules, and equivalent series inductance (ESL) exists in a current loop 2 between the IGBT module A1 and the IGBT module A2, where the parasitic inductance ESL is parasitic inductance existing among direct current bus capacitors of different power modules. Therefore, the problem to be solved currently is how to reduce the parasitic inductance.

SUMMARY

An objective of the present invention is to provide a power converter, so as to reduce parasitic inductance existing among direct current bus capacitors of different power modules in the power converter.

A first aspect of the present invention provides a power converter, including: at least two inverting modules, where direct current sides of the at least two inverting modules are connected in parallel using a laminated busbar or using a circuit board, alternating current sides of the at least two inverting modules are connected, and the at least two inverting modules run in parallel in an interleaved manner, where the laminated busbar includes at least two laminated busbar conducting layers, and a laminated busbar insulation layer, where the laminated busbar insulation layer is disposed between two neighboring laminated busbar conducting layers of the at least two laminated busbar conducting layers, and the at least two laminated busbar conducting layers include a positive laminated busbar conducting layer used to connect to a positive port of a direct current power supply and a negative laminated busbar conducting layer used to connect to a negative port of the direct current power supply, where the positive laminated busbar conducting layer is connected to a positive port of the at least two inverting modules; and the negative laminated busbar conducting layer is connected to a negative port of the at least two inverting modules; or the circuit board includes at least two circuit board conducting layers, and a circuit board insulation layer, where the circuit board insulation layer is disposed between two neighboring circuit board conducting layers of the at least two circuit board conducting layers, and the at least two circuit board conducting layers include a positive circuit board conducting layer used to connect to a positive port of the direct current power supply and a negative circuit board conducting layer used to connect to a negative port of the direct current power supply, where the positive circuit board conducting layer is connected to a positive port of the at least two inverting modules; and the negative circuit board conducting layer is connected to a negative port of the at least two inverting modules.

With reference to the first aspect of the present invention, in a first possible implementation manner, the number of laminated busbar conducting layers located between the positive laminated busbar conducting layer and the negative laminated busbar conducting layer is less than or equal to seven; or a distance between the positive laminated busbar conducting layer and the negative laminated busbar conducting layer is less than or equal to 15 millimeters (mm).

With reference to the first aspect of the present invention or the first possible implementation manner, in a second possible implementation manner, the number of circuit board conducting layers located between the positive circuit board conducting layer and the negative circuit board conducting layer is less than or equal to seven; or a distance between the positive circuit board conducting layer and the negative circuit board conducting layer is less than or equal to 15 mm.

With reference to the first aspect of the present invention or the first or second possible implementation manner of the first aspect, in a third possible implementation manner, the number of laminated busbar conducting layers in the laminated busbar is at least three, and the at least three laminated busbar conducting layers further include an N-pole laminated busbar conducting layer used to connect to an N-pole port of the at least two inverting modules, where the number of laminated busbar conducting layers located between the N-pole laminated busbar conducting layer and the positive laminated busbar conducting layer is less than or equal to seven, or a distance between the N-pole laminated busbar conducting layer and the positive laminated busbar conducting layer is less than or equal to 15 mm; and the number of laminated busbar conducting layers located between the N-pole laminated busbar conducting layer and the negative laminated busbar conducting layer is less than or equal to seven, or a distance between the N-pole laminated busbar conducting layer and the negative laminated busbar conducting layer is less than or equal to 15 mm.

With reference to the first aspect of the present invention or the first, second or third possible implementation manner of the first aspect, in a fourth possible implementation manner, the number of circuit board conducting layers in the circuit board of the at least two circuit board conducting layers is at least three, and the at least three circuit board conducting layers further include an N-pole circuit board conducting layer used to connect to an N-pole port of the at least two inverting modules; where the number of circuit board conducting layers located between the N-pole circuit board conducting layer and the positive circuit board conducting layer is less than or equal to seven, and the number of circuit board conducting layers located between the N-pole circuit board conducting layer and the negative circuit board conducting layer is less than or equal to seven; or a distance between the N-pole laminated busbar conducting layer and the positive laminated busbar conducting layer is less than or equal to 15 mm, and a distance between the N-pole laminated busbar conducting layer and the negative laminated busbar conducting layer is less than or equal to 15 mm.

With reference to the first aspect of the present invention or the first, second, third or fourth possible implementation manner of the first aspect, in a fifth possible implementation manner, the inverting modules include a three-phase inverting module.

With reference to the fifth possible implementation manner of the first aspect of the present invention, in a sixth possible implementation manner, the three-phase inverting module includes a three-phase inverting module formed by combining single-phase inverting modules.

With reference to the first aspect of the present invention or the first, second, third or fourth possible implementation manner of the first aspect, in a seventh possible implementation manner, the inverting modules include a single-phase inverting module.

With reference to the first aspect of the present invention or the first, second, third or fourth possible implementation manner of the first aspect, in an eighth possible implementation manner, the inverting modules include a multi-level inverting module.

With reference to the first aspect of the present invention or any one of the first to eighth possible implementation manners of the first aspect, in a ninth possible implementation manner, if the direct current sides of the at least two inverting modules are connected in parallel using the laminated busbar, a working current of the power converter is greater than 300 amperes (A).

With reference to the first aspect of the present invention or any one of the first to eighth possible implementation manners of the first aspect, in a tenth possible implementation manner, in a case in which the direct current sides of the at least two inverting modules are connected in parallel using the circuit board, a working current of the power converter is less than or equal to 300 A.

With reference to the first aspect of the present invention or any one of the first to tenth possible implementation manners of the first aspect, in an eleventh possible implementation manner, the laminated busbar conducting layers include a copper layer.

With reference to the first aspect of the present invention or any one of the first to tenth possible implementation manners of the first aspect, in a twelfth possible implementation manner, the circuit board conducting layers include a copper layer.

A second aspect of the present invention provides a power conversion system, including: a power generation apparatus, and the power converter described above, where the positive laminated busbar conducting layer which is included in the laminated busbar in the power converter and used to connect to a positive port of a direct current power supply is connected to a positive port of the power generation apparatus, the negative laminated busbar conducting layer which is included in the laminated busbar in the power converter and used to connect to a negative port of the direct current power supply is connected to a negative port of the power generation apparatus, and alternating current sides of at least two inverting modules in the power converter are connected to a power grid.

With reference to the second aspect of the present invention, in a first possible implementation manner of the second aspect, the power generation apparatus includes a photovoltaic power generation apparatus, or a wind power generation apparatus.

The power converter provided in the present invention is formed by connecting at least two inverting modules in parallel, and direct current sides of the at least two inverting modules are connected in parallel using a laminated busbar or a circuit board. Because a distance between a positive laminated busbar conducting layer and a negative laminated busbar conducting layer on a laminated busbar, or between a positive circuit board conducting layer and a negative circuit board conducting layer on a circuit board is small, the area of a current loop formed between the positive laminated busbar conducting layer and the negative laminated busbar conducting layer on the laminated busbar, or between the positive circuit board conducting layer and the negative circuit board conducting layer on the circuit board is small, and because parasitic inductance between the inverting modules is in direct proportion to the area bounded by the current loop, the parasitic inductance between the inverting modules is small. Because the parasitic inductance between the inverting modules is small, when the inverting modules are controlled to run in parallel in an interleaved manner, a current loop where the parasitic inductance between the inverting modules resides can eliminate most high-frequency ripple currents, so that high-frequency ripple currents flowing to a current loop where a bus capacitor resides are greatly reduced, that is, high-frequency ripple currents that need to be absorbed by the bus capacitor are greatly reduced, and therefore, bus capacitor usage is decreased as well as normal running of the power converter is ensured.

DESCRIPTION OF EMBODIMENTS

Figure 1:
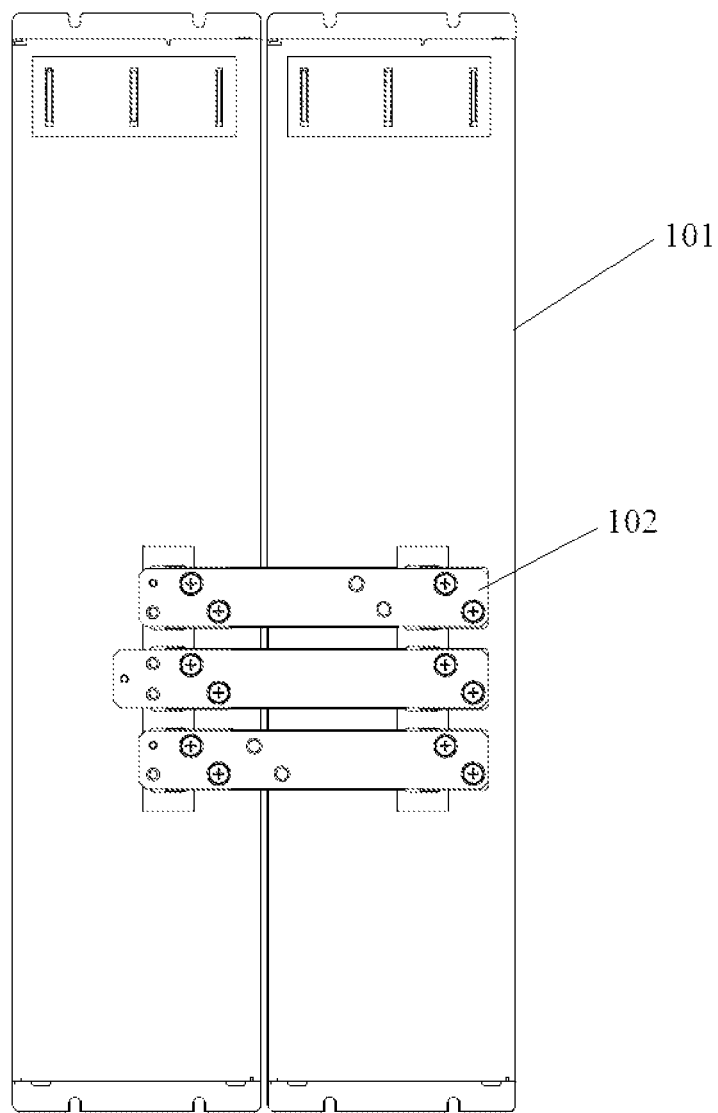
FIG. 1 is a schematic structural diagram in which power modules are directly connected in parallel using a copper bar.
Figure 2:
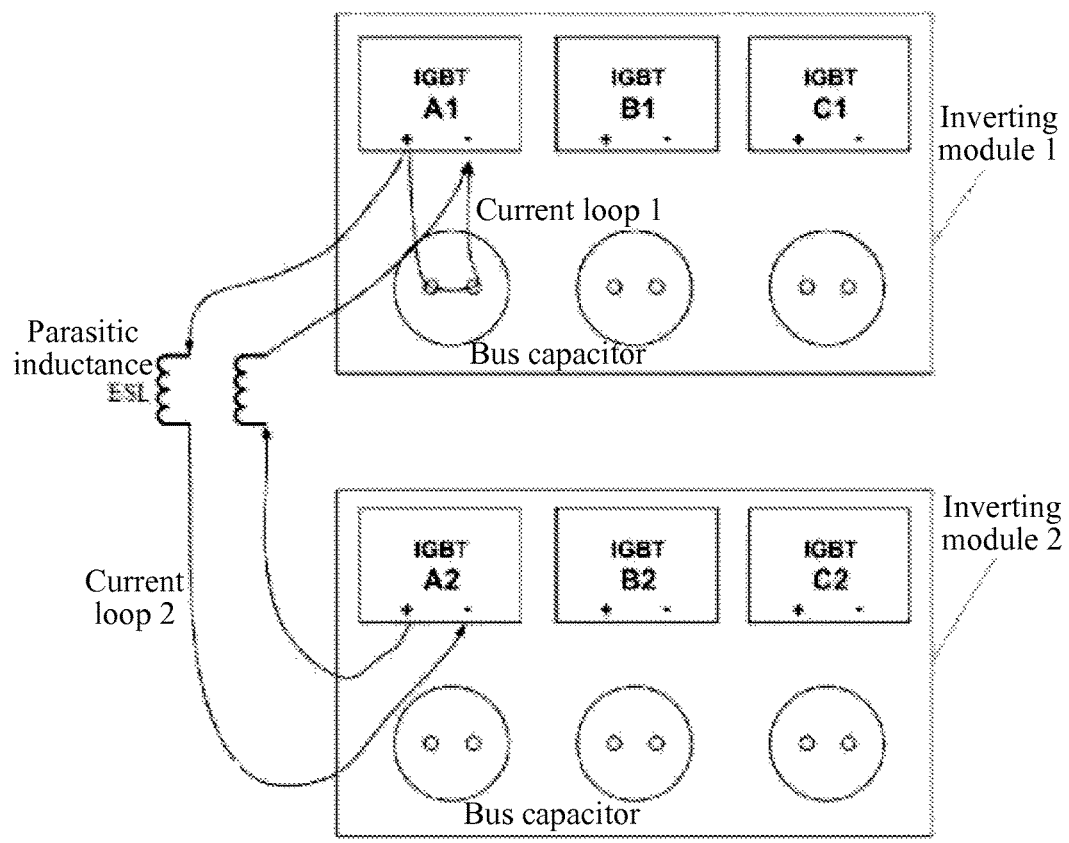
FIG. 2 is a schematic diagram of a circuit principle of two inverting modules connected in parallel.

The present invention is introduced in the embodiments listed below.

An embodiment of the present invention provides a power converter, including: at least two inverting modules, where direct current sides of the at least two inverting modules are connected in parallel using a laminated busbar, alternating current sides of the at least two inverting modules are connected, and the at least two inverting modules run in parallel in an interleaved manner. The laminated busbar includes at least two laminated busbar conducting layers, a laminated busbar insulation layer is disposed between the at least two laminated busbar conducting layers, and the at least two laminated busbar conducting layers include a positive laminated busbar conducting layer used to connect to a positive port of a direct current power supply and a negative laminated busbar conducting layer used to connect to a negative port of the direct current power supply, where the positive laminated busbar conducting layer is connected to a positive port of the at least two inverting modules; and the negative laminated busbar conducting layer is connected to a negative port of the at least two inverting modules.

Optionally, the number of laminated busbar conducting layers located between the positive laminated busbar conducting layer and the negative laminated busbar conducting layer may be 1, 2, 3, 4, 5, 6 or 7.

Optionally, a distance between the positive laminated busbar conducting layer and the negative laminated busbar conducting layer is less than or equal to 15 mm.

In the embodiment of the present invention, on one hand, the power converter is in a modular design, and formed by connecting inverting modules in parallel in an interleaved manner. When a capacity of the power converter needs to be expanded, only inverting modules needs to be added to the power converter, which is easy to perform. On the other hand, direct current sides of the inverting modules are connected in parallel using a laminated busbar, and compared with a case in which direct current sides of the inverting modules are connected in parallel using a copper bar, a distance between the positive laminated busbar conducting layer and the negative laminated busbar conducting layer on the laminated busbar is shorter, so that the area of a current loop formed between the positive laminated busbar conducting layer and the negative laminated busbar conducting layer on the laminated busbar is smaller. Because parasitic inductance between the inverting modules is in direct proportion to the area bounded by the current loop, the parasitic inductance between the inverting modules is small. Because the parasitic inductance between the inverting modules is small, when the inverting modules are controlled to run in parallel in an interleaved manner, a current loop where the parasitic inductance between the inverting modules resides can eliminate most high-frequency ripple currents, so that high-frequency ripple currents flowing to a current loop where a bus capacitor resides are greatly reduced, that is, high-frequency ripple currents that need to be absorbed by the bus capacitor are greatly reduced, and therefore, the power converter provided in the embodiment of the present invention reduces the demand for the bus capacitor.

Here it should be noted that, in the embodiment of the present invention, that the at least two inverting modules are connected in parallel in an interleaved manner includes the following situations: modulation wave signals of the at least two inverting modules that run in parallel are the same, and phase angles of carrier signals are staggered with each other.

Preferably, the number of laminated busbar conducting layers in the laminated busbar is at least three, and the at least three laminated busbar conducting layers further include an N-pole laminated busbar conducting layer used to connect to an N-pole port of the at least two inverting modules. The N-pole port may be used for grounding. The inverting modules are direct current (DC)/alternating current (AC) inverting modules.

Optionally, the number of laminated busbar conducting layers located between the N-pole laminated busbar conducting layer and the positive laminated busbar conducting layer may be 1, 2, 3, 4, 5, 6 or 7; and the number of laminated busbar conducting layers located between the N-pole laminated busbar conducting layer and the negative laminated busbar conducting layer may be 1, 2, 3, 4, 5, 6 or 7.

Optionally, a distance between the N-pole laminated busbar conducting layer and the positive laminated busbar conducting layer is less than or equal to 15 mm; and a distance between the N-pole laminated busbar conducting layer and the negative laminated busbar conducting layer is less than or equal to 15 mm.

Figure 3:
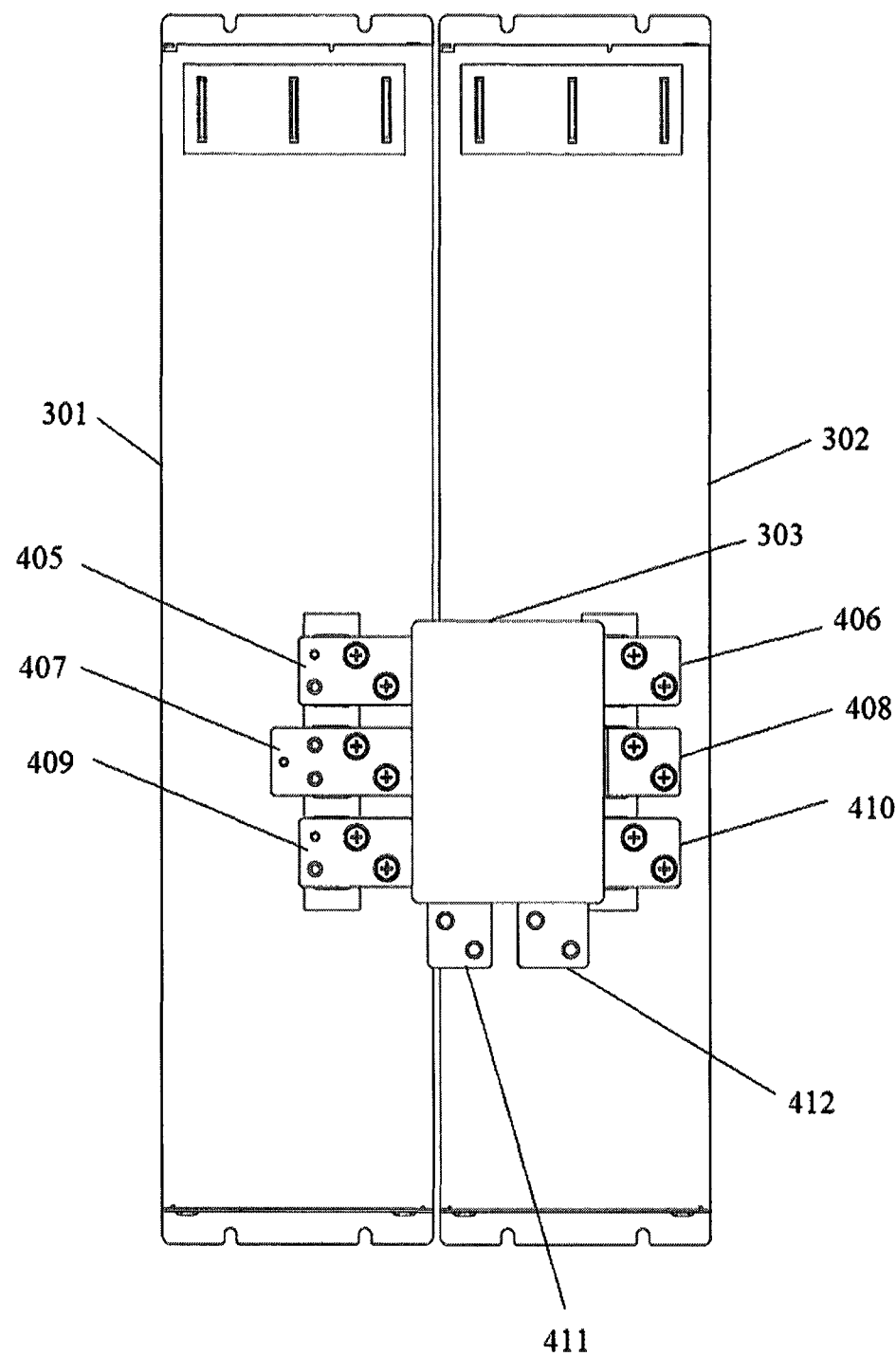
FIG. 3 is a schematic structural diagram in which two three-phase inverting modules are connected in parallel using a laminated busbar.
Figure 4:
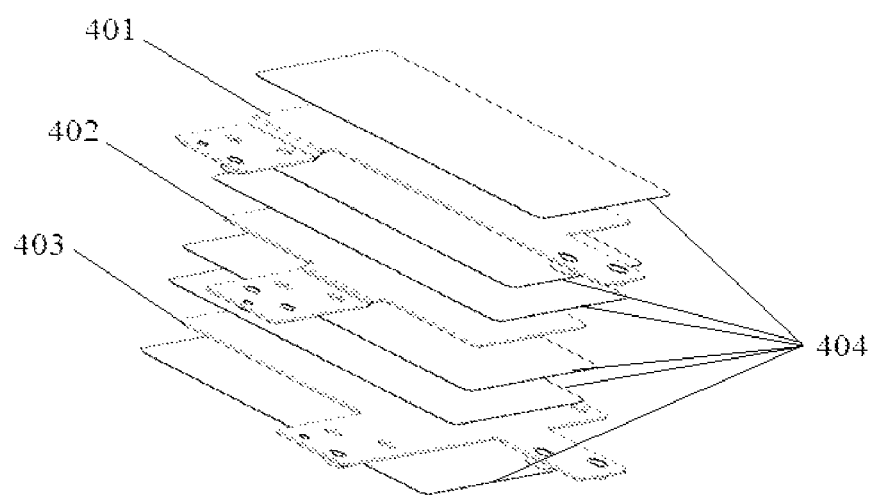
FIG. 4 is a schematic structural diagram of a disassembled laminated busbar.
Figure 5:
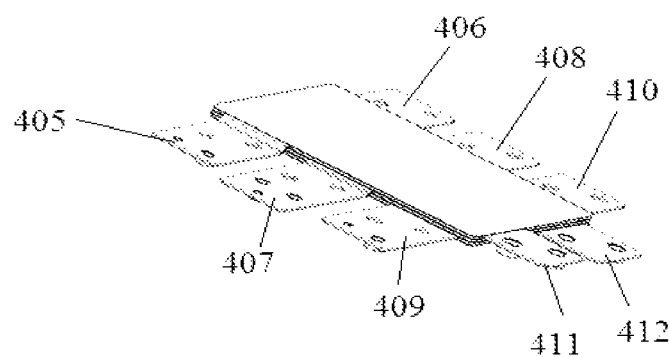
FIG. 5 is a schematic structural diagram of an assembled laminated busbar.

As shown in FIG. 3, FIG. 3 is a schematic structural diagram in which two three-phase inverting modules are connected in parallel using a laminated busbar, where the power converter includes a first three-phase inverting module 301 and a second three-phase inverting module 302, and the first three-phase inverting module 301 and the second three-phase inverting module 302 are connected in parallel using a laminated busbar. The laminated busbar 303 includes conducting layers and an insulation layer that is disposed between neighboring conducting layers, and further includes an insulation protection layer that coats an outer conducting layer of the laminated busbar. Here, the conducting layers may be a copper bar or an aluminum bar, materials of the insulation layer and the insulation protection layer may be Polyethylene terephthalate (PET), such as a PET film, may be NOMEX, and certainly, may be other insulation materials, which are not listed herein. FIG. 4 and FIG. 5 show specific structures of a laminated busbar, where the laminated busbar has three conducting layers in total, which are a first conducting layer 401, a second conducting layer 402 and a third conducting layer 403 separately, where at least two connecting ends are disposed on each conducting layer, and an insulation layer 404 is disposed between neighboring conducting layers. The first conducting layer 401 includes a first connecting end 405, a second connecting end 406 and a seventh connecting end 411, the second conducting layer includes a third connecting end 407, a fourth connecting end 408 and an eighth connecting end 412, and the third conducting layer includes a fifth connecting end 409 and a sixth connecting end 410. In FIG. 3, the seventh connecting end 411 on the laminated busbar 303 is used to connect to a positive port of a direct current power supply, and the eighth connecting end 412 on the laminated busbar 303 is used to connect to a negative port of the direct current power supply; and the first connecting end 405 on the laminated busbar 303 is connected to a positive port of the first three-phase inverting module 301, the second connecting end 406 on the laminated busbar 303 is connected to a positive port of the second three-phase inverting module 302, the third connecting end 407 on the laminated busbar 303 is connected to an N-pole port of the first three-phase inverting module 301, the fourth connecting end 408 on the laminated busbar 303 is connected to an N-pole port of the second three-phase inverting module 302, the fifth connecting end 409 on the laminated busbar 303 is connected to a negative port of the first three-phase inverting module 301, and the sixth connecting end 410 on the laminated busbar 303 is connected to a negative port of the second three-phase inverting module 302.

Preferably, in the power converter, the inverting modules include a three-phase inverting module.

Preferably, in the power converter, the three-phase inverting module includes a three-phase inverting module formed by combining a single-phase inverting module.

Preferably, in the power converter, the inverting modules include a single-phase inverting module.

Preferably, in the power converter, the inverting modules include a multi-level inverting module.

Preferably, in a case in which the direct current sides of the at least two inverting modules are connected in parallel using the laminated busbar, a working current of the power converter is greater than 300 A. The laminated busbar can bear a large current, and is appropriately applied to a large power converter whose working current is greater than 300 A, so as to reduce bus capacitor usage in the large power converter, and reduce the cost.

An embodiment of the present invention provides another power converter, including: at least two inverting modules, where direct current sides of the at least two inverting modules are connected in parallel using a circuit board, alternating current sides of the at least two inverting modules are connected, and the at least two inverting modules run in parallel in an interleaved manner. The circuit board includes at least two circuit board conducting layers, a circuit board insulation layer is disposed between the at least two circuit board conducting layers, and the at least two circuit board conducting layers include a positive circuit board conducting layer used to connect to a positive port of a direct current power supply and a negative circuit board conducting layer used to connect to a negative port of the direct current power supply, where the positive circuit board conducting layer is connected to a positive port of the at least two inverting modules; and the negative circuit board conducting layer is connected to a negative port of the at least two inverting modules.

Optionally, the number of circuit board conducting layers located between the positive circuit board conducting layer and the negative circuit board conducting layer may be 1, 2, 3, 4, 5, 6 or 7.

Optionally, a distance between the positive circuit board conducting layer and the negative circuit board conducting layer is less than or equal to 15 mm.

Optionally, the circuit board may be a printed circuit board (PCB).

The inverting modules are DC/AC inverting modules, and the conducting layers may be copper layers or other metal layers with good electrical conductivity.

In the embodiment of the present invention, on one hand, the power converter is in a modular design, and formed by connecting inverting modules in parallel in an interleaved manner. When a capacity of the power converter needs to be expanded, only inverting modules needs to be added to the power converter, which is easy to perform. On the other hand, direct current sides of the inverting modules are connected in parallel using the circuit board, and connecting ends on different conducting layers of the circuit board are connected to electrode ports in different polarities on the direct current sides of the inverting modules. Compared with a case in which direct current sides of the inverting modules are connected in parallel using a copper bar, a distance between the positive circuit board conducting layer and the negative circuit board conducting layer on the circuit board is smaller, so that the area of a current loop formed between the positive circuit board conducting layer and the negative circuit board conducting layer on the circuit board is shorter. Because parasitic inductance between the inverting modules is in direct proportion to the area bounded by the current loop, the parasitic inductance between the inverting modules is small. Because the parasitic inductance between the inverting modules is small, when the inverting modules are controlled to run in parallel in an interleaved manner, a current loop where the parasitic inductance between the inverting modules resides can eliminate most high-frequency ripple currents, so that high-frequency ripple currents flowing to a current loop where a bus capacitor resides are greatly reduced, that is, high-frequency ripple currents that need to be absorbed by the bus capacitor are greatly reduced, and therefore, the power converter provided in the embodiment of the present invention reduces the demand for the bus capacitor.

In the embodiment of the present invention, that the at least two inverting modules are connected in parallel in an interleaved manner includes the following situations: modulation wave signals of the at least two inverting modules that run in parallel are the same, and phase angles of carrier signals are staggered with each other.

Preferably, the number of circuit board conducting layers in the circuit board is at least three, and the at least three circuit board conducting layers further include an N-pole circuit board conducting layer used to connect to an N-pole port of the at least two inverting modules. The N-pole port may be used for grounding. The inverting modules are DC/AC inverting modules.

Optionally, the number of laminated busbar conducting layers located between the N-pole laminated busbar conducting layer and the positive laminated busbar conducting layer may be 1, 2, 3, 4, 5, 6 or 7; and the number of laminated busbar conducting layers located between the N-pole laminated busbar conducting layer and the negative laminated busbar conducting layer may be 1, 2, 3, 4, 5, 6 or 7.

Optionally, a distance between the N-pole laminated busbar conducting layer and the positive laminated busbar conducting layer is less than or equal to 15 mm; and a distance between the N-pole laminated busbar conducting layer and the negative laminated busbar conducting layer is less than or equal to 15 mm.

Figure 6:
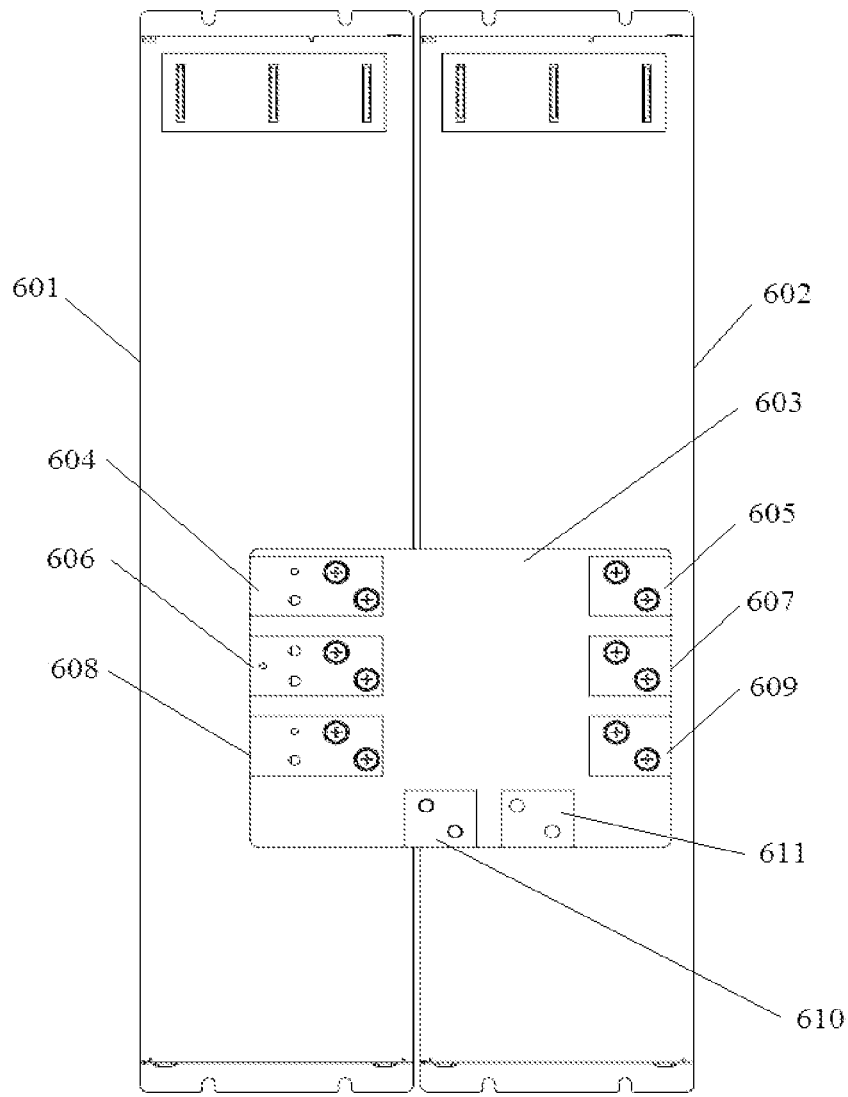
FIG. 6 is a schematic structural diagram in which two three-phase inverting modules are connected in parallel using a circuit board.

As shown in FIG. 6, an embodiment of the present invention further provides a power converter, including two three-phase inverting modules, which are a third three-phase inverting module 601 and a fourth three-phase inverting module 602 separately, where the two three-phase inverting modules are connected in parallel in an interleaved manner using a multilayer circuit board 603. The multilayer circuit board 603 includes multiple conducting layers and an insulation layer that is disposed between neighboring conducting layers, and the conducting layers may be copper layers. The conducting layers include a first conducting layer, a second conducting layer and a third conducting layer, where at least two connecting ends are disposed on each conducting layer, and the connecting end is corresponding to an electrode port of the inverting module, and may be formed by etching. Specifically, a connecting end 610 of the first conducting layer is used to connect to a positive port of a direct current power supply, and a connecting end 611 of the third conducting layer is used to connect to a negative port of the direct current power supply; and a first connecting end 604 of the first conducting layer is used to connect to a positive port of the third three-phase inverting module 601, a second connecting end 605 of the first conducting layer is connected to a positive port of the fourth three-phase inverting module 602, a third connecting end 606 of the second conducting layer is connected to an N-pole port of the third three-phase inverting module 601, a fourth connecting end 607 of the second conducting layer is connected to an N-pole port of the fourth three-phase inverting module 602, a fifth connecting end 608 of the third metal layer is connected to a negative port of the third three-phase inverting module 601, and a sixth connecting end 609 of the third metal layer is connected to a negative port of the fourth three-phase inverting module 602.

Preferably, in the power converter, the inverting modules include a three-phase inverting module.

Preferably, in the power converter, the three-phase inverting module includes a three-phase inverting module formed by combining a single-phase inverting module.

Preferably, in the power converter, the inverting modules include a single-phase inverting module.

Preferably, in a case in which the direct current sides of the at least two inverting modules are connected in parallel using the circuit board, a working current of the power converter is less than or equal to 300 A. The circuit board is appropriately applied to a power converter whose working current is less than or equal to 300 A, so as to reduce bus capacitor usage in the power converter, and reduce the cost.

An embodiment of the present invention further provides a method for controlling a power converter, including: controlling at least two inverting modules in the power converter according to the foregoing embodiments in an interleaved and parallel manner. When the inverting modules are controlled to run in parallel in an interleaved manner, a current loop where the parasitic inductance between the inverting modules resides can eliminate most high-frequency ripple currents, so that high-frequency ripple currents flowing to a current loop where a bus capacitor resides are greatly reduced, that is, high-frequency ripple currents that need to be absorbed by the bus capacitor are greatly reduced, and therefore, using the method of the embodiment of the present invention, the demand for the bus capacitor can be reduced, so that normal running of the power converter is not affected even if the bus capacitor usage is decreased.

Figure 7:
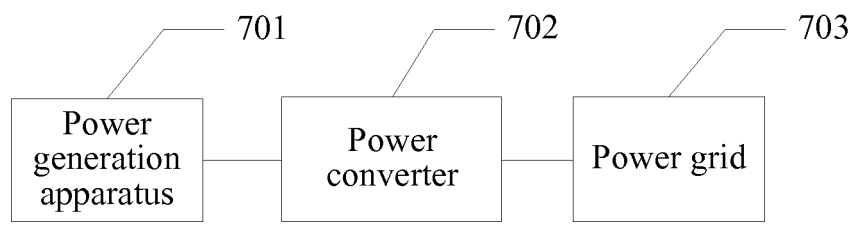
FIG. 7 is a schematic structural diagram of a power conversion system.

As shown in FIG. 7, an embodiment of the present invention further provides a power conversion system, including the power converter 702 according to the foregoing embodiment, where the positive laminated busbar conducting layer which is included in the laminated busbar in the power converter 702 and used to connect to a positive port of a direct current power supply is connected to a positive port of a power generation apparatus 701, the negative laminated busbar conducting layer which is included in the laminated busbar in the power converter 702 and used to connect to a negative port of the direct current power supply is connected to a negative port of the power generation apparatus 701, and alternating current sides of at least two inverting modules in the power converter 702 are connected to a power grid. The power converter 702 is configured to receive a direct current input by the power generation apparatus 701, convert the direct current into an alternating current with a predetermined frequency and a predetermined voltage and feed in the alternating current to the power grid 703. The power generation apparatus 701 includes a photovoltaic power generation apparatus, or a wind power generation apparatus.

A person of ordinary skill in the art may understand that all or a part of the steps of the methods in the embodiments may be implemented by a program instructing relevant hardware. The program may be stored in a computer readable storage medium. The storage medium may include: a read-only memory (ROM), a random access memory (RAM), a magnetic disk, or an optical disc.

The power converter provided in the embodiments of the present invention is introduced above in detail. In this specification, specific examples are used to describe the principle and implementation manners of the present invention, and the description of the embodiments is only intended to make the method and core idea of the present invention more comprehensible. In addition, a person of ordinary skill in the art may, based on the idea of the present invention, make modifications with respect to the specific implementation manners and the application scope. Therefore, the content of this specification shall not be construed as a limitation to the present invention.

What is claimed is:

1. A power converter, comprising:
two inverters running in parallel in an interleaved manner, each inverter comprising:
an inverter positive port;
an inverter negative port;
an N-pole port;
an alternating current side connected to the alternating current side of the other inverter; and
a direct current side connected in parallel to the direct current side of the other inverter using a circuit board, the circuit board comprising at least two circuit board conducting layers and a circuit board insulation layer, the circuit board conducting layers comprising an N-pole circuit board conducting layer coupled to the N-pole port, the circuit board insulation layer disposed between two of the circuit board conducting layers, each of the circuit board conducting layers comprising:
a positive circuit board conducting layer coupled to the inverter positive ports and configured to couple to a direct current power supply positive port; and
a negative circuit board conducting layer coupled to the inverter negative ports and configured to couple to a direct current power supply negative port.

2. The power converter of claim 1, wherein a number of circuit board conducting layers located between the positive circuit board conducting layer and the negative circuit board conducting layer is less than or equal to seven.

3. The power converter of claim 1, wherein the inverters comprise a three-phase inverter.

4. The power converter of claim 3, wherein the three-phase inverter comprises a three-phase inverter formed by combining single-phase inverters.

5. The power converter of claim 1, wherein the inverters comprise a single-phase inverter.

6. The power converter of claim 1, wherein the inverters comprise a multi-level inverter.

7. The power converter of claim 1, wherein a working current of the power converter is less than or equal to 300 amperes (A).

8. The power converter of claim 1, wherein the circuit board conducting layers comprise a copper layer.

9. The power converter of claim 1, wherein a number of circuit board conducting layers is at least three, the circuit board conducting layers further comprise an N-pole circuit board conducting layer configured to connect to an N-pole port of the inverters, a distance between the N-pole circuit board conducting layer and the positive circuit board conducting layer is less than or equal to 15 millimeters (mm), a distance between the positive circuit board conducting layer and the negative circuit board conducting layer is less than or equal to 15 mm, and the number of circuit board conducting layers located between the N-pole circuit board conducting layer and the negative circuit board conducting layer is less than or equal to seven.

10. A power converter, comprising:
two inverters running in parallel in an interleaved manner, each inverter comprising:
an N-pole port;
an alternating current side connected to the alternating current side of the other inverter; and
a direct current side connected in parallel to the direct current side of the other inverter using a circuit board, the circuit board comprising at least three circuit board conducting layers and a circuit board insulation layer, the circuit board insulation layer disposed between two of the circuit board conducting layers and comprising an N-pole circuit board conducting layer coupled to the N-pole port.

11. The power converter of claim 10, wherein each of the inverters further comprises an inverter positive port and an inverter negative port, and each of the circuit board conducting layers comprises:
a positive circuit board conducting layer coupled to the inverter positive ports and configured to couple to a direct current power supply positive port; and
a negative circuit board conducting layer coupled to the inverter negative ports and configured to couple to a direct current power supply negative port, a distance between the positive circuit board conducting layer and the negative circuit board conducting layer being less than or equal to 15 millimeters (mm).

12. The power converter of claim 10, wherein a number of circuit board conducting layers is at least three, the circuit board conducting layers further comprise an N-pole circuit board conducting layer configured to connect to an N-pole port of the inverters, the number of circuit board conducting layers located between the N-pole circuit board conducting layer and the positive circuit board conducting layer is less than or equal to seven, and the number of circuit board conducting layers located between the N-pole circuit board conducting layer and the negative circuit board conducting layer is less than or equal to seven.

13. The power converter of claim 10, wherein a working current of the power converter is less than or equal to 300 amperes (A).

14. The power converter of claim 10, wherein a number of circuit board conducting layers is at least three, the circuit board conducting layers further comprise an N-pole circuit board conducting layer configured to connect to an N-pole port of the inverters, a distance between the N-pole circuit board conducting layer and the positive circuit board conducting layer is less than or equal to 15 millimeters (mm), a distance between the positive circuit board conducting layer and the negative circuit board conducting layer is less than or equal to 15 mm, and the number of circuit board conducting layers located between the N-pole circuit board conducting layer and the negative circuit board conducting layer is less than or equal to seven.

15. A power converter, comprising:
two inverters running in parallel in an interleaved manner, each inverter comprising:
an N-pole port;
an alternating current side connected to the alternating current side of the other inverter; and
a direct current side connected in parallel to the direct current side of the other inverter using a laminated busbar, the laminated busbar comprising at least three laminated busbar conducting layers and a laminated busbar insulation layer, the laminated busbar insulation layer disposed between two of the laminated busbar conducting layers and comprising an N-pole laminated busbar conducting layer coupled to the N-pole port.

16. The power converter of claim 15, wherein each of the inverters further comprises an inverter positive port and an inverter negative port, and each of the laminated busbar conducting layers comprises:
a positive laminated busbar conducting layer coupled to the inverter positive ports and configured to couple to a direct current power supply positive port; and
a negative laminated busbar conducting layer coupled to the inverter negative ports and configured to couple to a direct current power supply negative port, a distance between the positive laminated busbar conducting layer and the negative laminated busbar conducting layer being less than or equal to 15 millimeters (mm).

17. The power converter of claim 15, wherein a number of laminated busbar conducting layers is at least three, the laminated busbar conducting layers further comprise an N-pole laminated busbar conducting layer configured to connect to an N-pole port of the inverters, the number of laminated busbar conducting layers located between the N-pole laminated busbar conducting layer and the positive laminated busbar conducting layer is less than or equal to seven, and the number of laminated busbar conducting layers located between the N-pole laminated busbar conducting layer and the negative laminated busbar conducting layer is less than or equal to seven.

18. The power converter of claim 15, wherein a working current of the power converter is less than or equal to 300 amperes (A).

19. The power converter of claim 15, wherein a number of laminated busbar conducting layers is at least three, the laminated busbar conducting layers further comprise an N-pole laminated busbar conducting layer configured to connect to an N-pole port of the inverters, a distance between the N-pole laminated busbar conducting layer and the positive laminated busbar conducting layer is less than or equal to 15 millimeters (mm), a distance between the positive laminated busbar conducting layer and the negative laminated busbar conducting layer is less than or equal to 15 mm, and the number of laminated busbar conducting layers located between the N-pole laminated busbar conducting layer and the negative laminated busbar conducting layer is less than or equal to seven.

* * * * *